US006950995B2

(12) United States Patent
Hegde et al.

(10) Patent No.: US 6,950,995 B2
(45) Date of Patent: Sep. 27, 2005

(54) METHOD OF RESOLVING MISMATCHED GRAPHICAL SYMBOLS IN COMPUTER-AIDED INTEGRATED CIRCUIT DESIGN

(75) Inventors: Shailesh U. Hegde, Cary, NC (US); Melvin T. Isom, III, Durham, NC (US)

(73) Assignee: Infineon Technologies AG, Munich (DE)

(*) Notice: Subject to any disclaimer, the term of this patent is extended or adjusted under 35 U.S.C. 154(b) by 295 days.

(21) Appl. No.: 10/348,847

(22) Filed: Jan. 21, 2003

(65) Prior Publication Data

US 2004/0143807 A1 Jul. 22, 2004

(51) Int. Cl.[7] .............................................. G06F 17/50
(52) U.S. Cl. ................................. 716/1; 716/3; 716/11
(58) Field of Search .................................. 716/1, 3, 11

(56) References Cited

U.S. PATENT DOCUMENTS

| | | | | |
|---|---|---|---|---|
| 5,404,319 A | * | 4/1995 | Smith et al. | 716/18 |
| 5,459,673 A | * | 10/1995 | Carmean et al. | 716/6 |
| 5,757,655 A | * | 5/1998 | Shih et al. | 716/2 |
| 5,963,727 A | * | 10/1999 | Shih et al. | 716/1 |
| 6,032,149 A | * | 2/2000 | Kendall et al. | 707/102 |

OTHER PUBLICATIONS

"Introduction to Skill and Skill Programming—Training Manual Version 4.4.1," Cadence Design Systems, Inc., Apr. 11, 1997, pp. i–xviii, 1–2–17–26, A–1–C13.
"Introduction to Skill and Skill Programming—Lab Book Version 4.4.1," Cadence Design Systems, Inc., Apr. 11, 1997, pp. i–xiii, 1–1–17–15, A–1–A–10.
"Virtuoso Schematic Composer," Cadence Design Systems, Inc. Datasheet (2003).
Levi et al., "Down to the Wire—Requirements for Nanometer Design Implementation," Cadence Design Systems, Inc. White Paper (2002).
"Physical Design Retargeting," Sagantec North America, Inc. [online] [retrieved on Apr. 3, 2003], retrieved from the Internet <URL:www.sagantec.com/html/physical.html>.
"Libraries & Silicon Infrastructure," Sagantec North America, Inc. [online] [retrieved on Apr. 3, 2003], retrieved from the Internet <URL: www.sagantec.com/html/library.html>.
"SiClone—Accelerate Physical Implementation and Closure for Full Custom Design," Sagantec North America, Inc. Datasheet (2000).
"Hurricane—Re-Use and Optimize Your Existing, Silicon-Proven Intellectual Property," Sagantec North American, Inc. Datasheet (2000).
"Companion—Accelerate Your Full Custom Layout Design by 2X–10X!," Sagantec North America, Inc. Datasheet (2000).
"Perl 5.6 Documentation," [online] [retrieved on Apr. 4, 2003], retrieved from the Internet <URL: www.perldoc.com/perl5.6/pod/perl.html>.
"Programming Languages–C++, Language de progrmmation = C++," America National Standard Institute, International Standard, ISO/IEC 14882, Jul. 27, 1998, pp. i–xxvi, 1–749.

* cited by examiner

Primary Examiner—Matthew Smith
Assistant Examiner—Brandon Bowers
(74) Attorney, Agent, or Firm—Brinks Hofer Gilson & Lione

(57) ABSTRACT

A system and method for resolving mismatched graphical symbols in computer-aided design of integrated circuits during schematic migration. The system compares the dimensions of the graphical symbols within the circuit primitives of the target and source schematic databases and detects if the parameters are different. If so, the system alters the graphical symbols in the target circuit primitive to resolve the mismatch.

14 Claims, 9 Drawing Sheets

FIG. 6
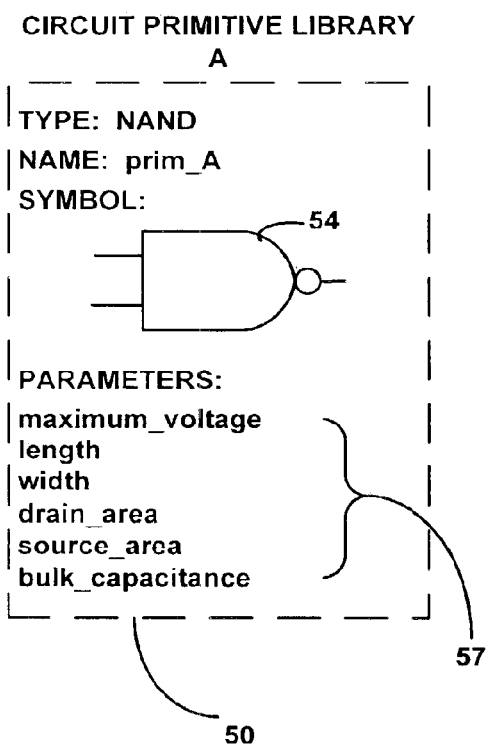
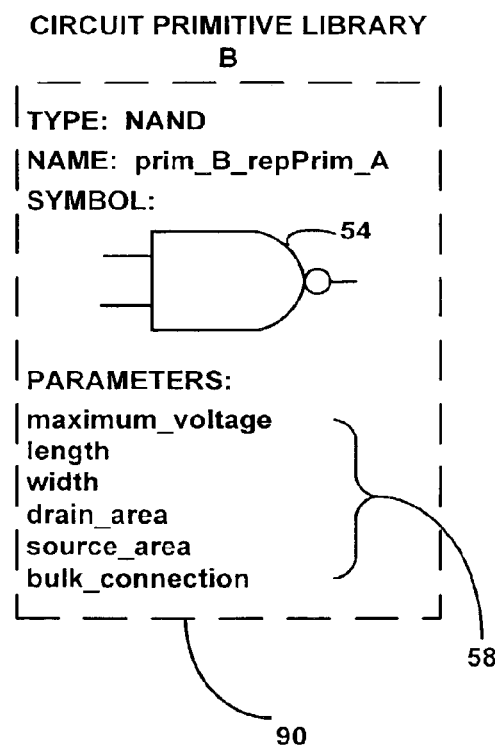

FIG. 8
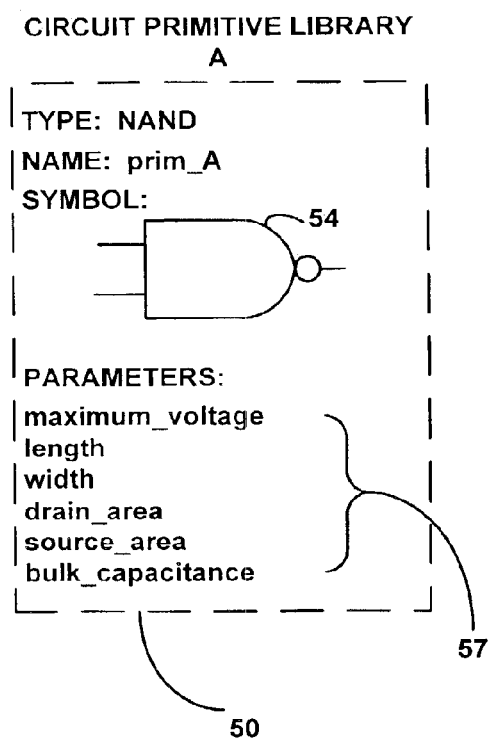
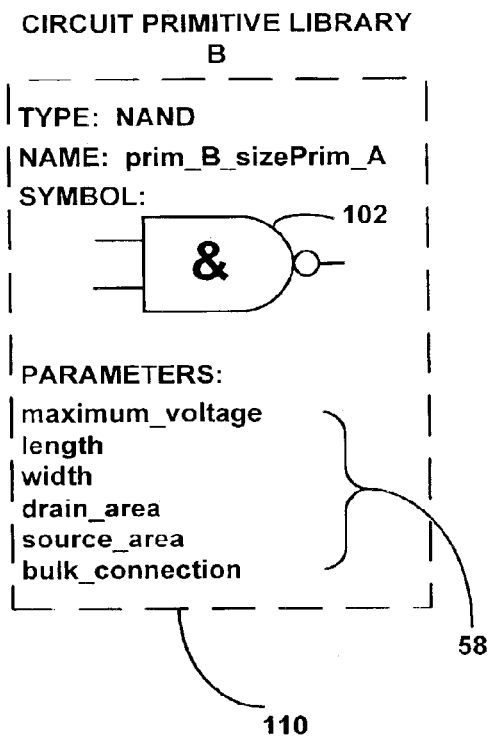

METHOD OF RESOLVING MISMATCHED GRAPHICAL SYMBOLS IN COMPUTER-AIDED INTEGRATED CIRCUIT DESIGN

FIELD OF THE INVENTION

This invention relates to integrated circuit design. More particularly, the invention relates to a method of resolving mismatched graphical symbols in computer-aided integrated circuit design.

BACKGROUND

Many integrated circuits are designed using computer-aided design ("CAD") programs running on a workstation. The designer typically selects electronic components for the integrated circuit through a graphical user interface ("GUI"), which includes a graphical display screen and a computer mouse or similar pointing device, familiar to those of ordinary skill in the art.

The electronic components are represented graphically by the CAD program on the graphical display screen. To position the electronic component within the part of the integrated circuit's schematic that is displayed on the screen, the designer "drags" the graphical symbol for the component to a position on the screen using the mouse. The designer "drops" the graphical symbol for the electronic component at the desired position on the screen and connects the graphical representation of the terminals of the electronic component to the terminals of other electronic components displayed on the screen. Connecting the graphical representation of the terminals in the GUI represents forming an electrical connection between the components on the designed integrated circuit.

Upon completing or editing the schematic for the part of the integrated circuit that is being designed, the designer may save the schematic as a circuit block. The circuit block consolidates the components in the schematic into a single entity for use within the CAD program. The designer assigns alphanumeric strings to the inputs and outputs of the circuit block for identifying the inputs/outputs, and also assigns an alphanumeric string to the circuit block as a name that identifies the circuit block. The circuit block may be added to a library of circuit blocks, catalogued by the assigned alphanumeric names, and represented as a circuit block on the GUI. Thereafter, the designer may connect the circuit blocks using the GUI in the same manner as with individual components by interconnecting the inputs and outputs of the circuit blocks.

Circuit blocks may be combined to form higher level circuit blocks resulting in a hierarchy of circuit blocks available to the designer. For example, an arithmetic processor circuit block may comprise at least one binary adder circuit block. The binary adder circuit block in turn may comprise multiple XOR logic gate components. The XOR logic gate components may comprise multiple NAND logic gate components, which in turn comprise multiple Complementary Metal Oxide Semiconductor ("CMOS") transistors. The designer typically stores the hierarchy of circuit blocks in a schematic database.

The CAD program may also create a graphical representation of the masks that are used in projection lithography to lay out the transistors and interconnections of the circuit blocks on a substrate for the integrated circuit. Alternatively the CAD program may control an electron-beam lithographic device to directly draw the masks on the integrated circuit substrate. The masks sequentially form layers of the semiconductor structures of the individual transistors on the substrate.

As manufacturing technology develops, a circuit designed originally in older technology may be reused as a circuit in the newer technology. Importing the schematic from one database to another saves designing the schematic from scratch in the new technology. For example, when designing an arithmetic processor for an integrated circuit that is to be built according to 140 nm CMOS technology, the designer may reuse the schematic for the processor from the schematic database for 170 nm CMOS technology. (The 140 nm and 170 nm refer to the minimum feature size on the respective technologies.) The schematic databases for 140 nm and 170 nm technology may differ in several ways, not the least of which is that the graphical representations of the masks for 140 nm technology typically include smaller semiconductor structures than the respective structures in 170 nm technology.

Moreover, some integrated circuits may include CMOS structures according to both technologies. For example, an integrated circuit may use 140 nm CMOS transistors in most circuit blocks, but use 170 nm CMOS transistors for components that are required to operate at a higher voltage than the 140 nm transistors. The schematics for such circuit blocks require distinguishable graphical symbols for the components of each structure size in order to clearly identify the 140 nm components and the 170 nm components. Therefore each structure size may have distinguishable graphical symbols and parameters associated with the symbols, such as the transistor gate thickness or the maximum drain-to-source voltage.

Transferring a design for an electronic circuit block from the schematic databases for one technology to the schematic database for another technology may lead to mismatches between the symbols and/or parameters. Additionally, different teams that are jointly developing the same design may use different schematic databases, leading to further mismatches when transferring designs between the schematic databases. The process of transferring designs between different schematic databases is termed "schematic migration" by those of ordinary skill in the art. Moreover, the schematic databases may not contain similarly sized graphical symbols for a particular component, which hinders the effective transfer of a design to this schematic database if the design includes the particular component. Therefore there is a need for a method for resolving mismatched graphical symbols in CAD programs during schematic migration.

SUMMARY

A method and system are described below to address the need for a system and method for resolving mismatched graphical symbols in a computer-aided integrated circuit design system.

In accordance with one aspect of the invention, a method of resolving mismatched graphical symbols in a computer-aided integrated circuit design system is provided. The method includes reading a source dimension of a source graphical symbol from a source circuit primitive in a source schematic database. The method also includes reading a corresponding target dimension of a target graphical symbol from a target circuit primitive in a target schematic database. The target circuit primitive corresponds to the source circuit primitive. The method further includes automatically comparing the source dimension with the target dimension and altering the target graphical symbol in the target circuit primitive if the source dimension and the target dimension are not identical.

Another aspect of the invention is a system for resolving mismatched graphical symbols in a computer-aided integrated circuit design system is provided. The system includes means for reading a source dimension of a source graphical symbol from a source circuit primitive in a source schematic database. The system also includes means for reading a corresponding target dimension of a target graphical symbol from a target circuit primitive in a target schematic database. The target circuit primitive corresponds to the source circuit primitive. The system further includes means for automatically comparing the source dimension with the target dimension and means for altering the target graphical symbol in the target circuit primitive if the source dimension and the target dimension are not identical.

The foregoing and other features and advantages of preferred embodiments will be more readily apparent from the following detailed description, which proceeds with reference to the accompanying drawings.

BRIEF DESCRIPTION OF THE DRAWINGS

FIG. 6 is a block diagram illustrating an exemplary target circuit primitive with a replaced mismatched target graphical symbol in the computer-aided integrated circuit design system of FIG. 1;

FIG. 8 is a block diagram illustrating an altered target circuit primitive with the resized target graphical symbol of FIG. 7.

DETAILED DESCRIPTION OF THE PRESENTLY PREFERRED EMBODIMENTS

Integrated circuits, due to their complexity, are typically designed using CAD tools, which are computer programs that allow the designer to build the schematic layout for the internal circuitry of the integrated circuit, simulate the electronic behavior of sections of the circuitry, and create photolithographic masks for constructing the circuits on the substrate of the integrated circuit. Examples of CAD tools include the Cadence tools manufactured by Cadence Design Systems, Inc. of San Jose, Calif., and those based on programming languages including the C++ programming language and the Practical Extraction and Reporting Language ("Perl"). Information on C++ may be found in the American National Standards Institute ("ANSI") standard ISO/IEC 14882, titled "Programming languages—C++," dated 1998, and information on Perl may be found at the Perl webpage. Perl home page [online]. O'Reilly, 1999 [retrieved on Sep. 20, 2002 -20]. Retrieved from the Internet: <URL: http:/www.perl.com>

Figure 1:
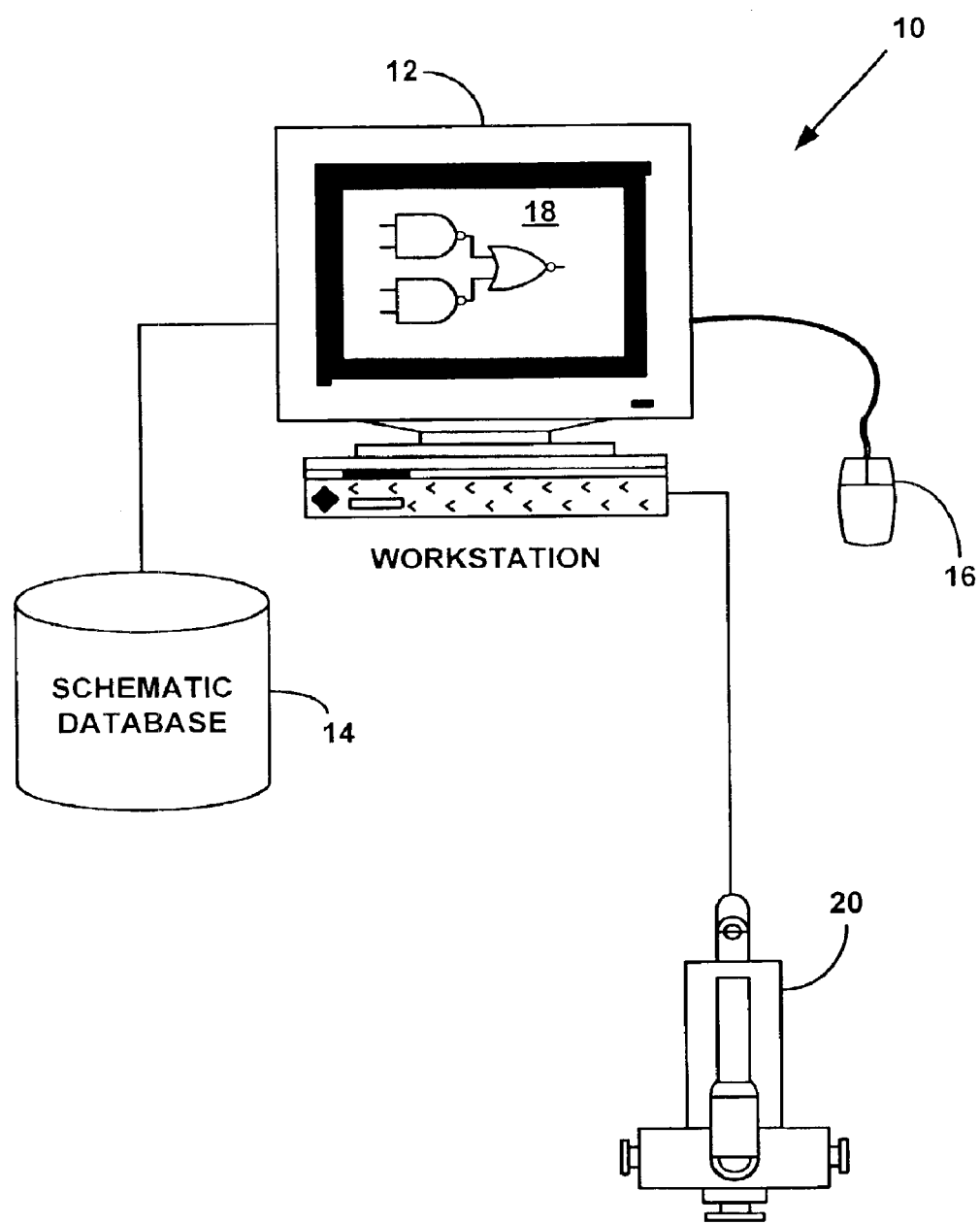
FIG. 1 is a block diagram illustrating a preferred configuration of a computer-aided integrated circuit design system.

FIG. 1 is a block diagram illustrating a preferred configuration of a computer-aided integrated circuit design system 10. The designer typically selects electronic components for the integrated circuit using a GUI running on a workstation 12. For example, the system 10 may include a computer workstation 12 manufactured by Silicon Graphics, Incorporated of Mountain View, Calif. A schematic database 14 is in communication with the workstation 12 and stores information on the graphical symbols for the electronic components of the design. In one embodiment, the GUI includes a graphical display screen 18 and a computer mouse 16, familiar to those of ordinary skill in the art. The workstation 12 is in communication with the mouse 16 or other graphical input device and interacts with the mouse 16 and display screen through a GUI program running on the workstation 12.

The designer uses the mouse 16 to select an electronic component from the schematic database 14. The designer drags and drops the graphical symbol for the electronic components at a desired position within a schematic that is displayed on a display screen 18 of the workstation 12. The designer connects the terminals of the selected electronic component to terminals of other components in the schematic with the mouse 16 by drawing lines between the graphical symbols displayed by the GUI on the workstation's 12 display screen 18.

The designer may also instruct the CAD system 10 to create a graphical representation of the masks that are used to layout the transistors and interconnections of the electronic circuit blocks on a substrate for the integrated circuit. The CAD system 10 retrieves a representation of the geometric structure of each semiconductor device corresponding to an electronic component from the schematic database and lays out the geometrical structures that correspond to the schematic on the integrated circuit's substrate. Further processing by the CAD system 10 and the workstation 12 produces the graphical representations of the masks that are used to sequentially build the geometric structures using the photolithographic processes that make the integrated circuit. The graphical representations of the masks may be displayed on the workstation 12 or output to a lithographic device 20 that either, as is familiar to those of ordinary skill in the art, draws the mask on a glass plate as in optical lithography, or draws the mask directly on the integrated circuit substrate as in electron-beam lithography.

An operating environment for the CAD system 10 includes a processing system with at least one Central Processing Unit ("CPU") and a memory system. Preferably, the at least one CPU controls the operations of the workstation 12. In accordance with the practices of persons skilled in the art of computer programming, the preferred methods are described herein with reference to acts and symbolic representations of operations that are performed by the processing system, unless indicated otherwise.

It will be appreciated that the acts and symbolically represented operations include the manipulation of electrical signals by the CPU. The electrical signals represent data bits that cause a resulting transformation or reduction of the electrical signal representation. The workstation 12 and other devices of the CAD system 10 may maintain data bits at memory locations in their respective memory systems to reconfigure or otherwise alter their CPU's operation, as well as other processing of signals, or maintain data bits on the schematic database 14. The memory locations, such as random access memory ("RAM") or the medium of the schematic database 14, are physical locations that have particular electrical, magnetic, or optical properties corresponding to the data bits, depending on the type of memory used. For example, the medium of the schematic database 14 may be a magnetic hard disc and/or a compact disc read only memory ("CD-ROM") having written thereon data structures and/or data files as is familiar to those of skill in the art.

The data bits may also be maintained on a computer readable medium including magnetic disks, optical disks, and any other volatile or non-volatile mass storage system readable by the CPU. The computer readable medium includes cooperating or interconnected computer readable media that exist exclusively on the CAD system 10 or are distributed among multiple interconnected processing systems that may be local to or remote to the CAD system 10.

Figure 2:
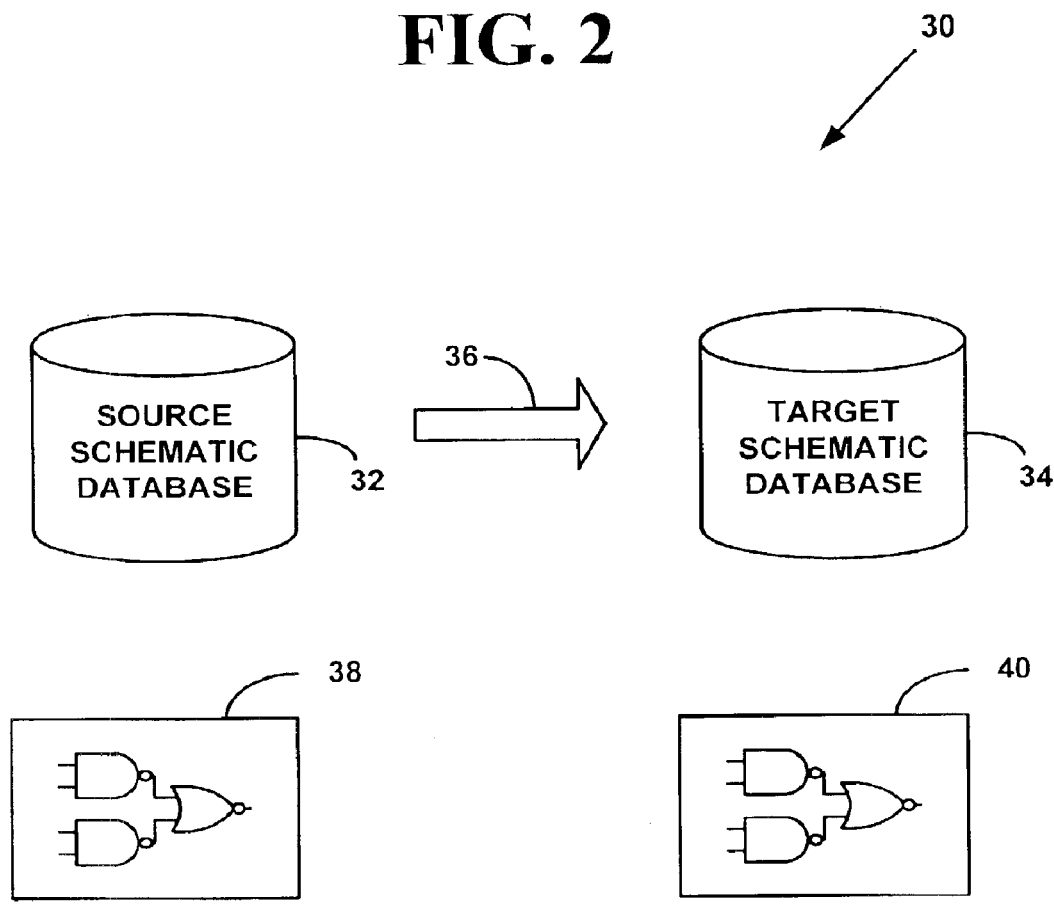
FIG. 2 is a block diagram illustrating a schematic migration from a source schematic database to a target schematic database in the computer-aided integrated circuit design system of FIG. 1.

FIG. 2 is a block diagram illustrating a schematic migration 30 from a source schematic database 32 to a target schematic database 34 in the computer-aided integrated circuit design system 10 of FIG. 1. The schematic databases 32, 34 include representations of electronic circuit blocks that are built out of circuit primitives. A circuit primitive represents a component of an electronic design with which the designer constructs a schematic 38, 40. Examples of circuit primitives include transistors, inverters, NAND logic gates, NOR logic gates, and flip-flops. Circuit primitives are stored in respective circuit primitive libraries in the schematic databases 32, 34. An entry for a circuit primitive in a circuit primitive library is stored as a data structure in the computer readable medium that hosts the schematic database 32, 34.

As is known to those of ordinary skill in the circuit design art, a designer may design an analog circuit according to a schematic comprising transistors, discrete components, operational amplifiers and other analog circuit primitives. Also the designer may design a digital circuit according to a schematic comprising logic gates. In the latter case, the circuit primitives are the basic logic gates. But there are a variety of transistor designs for, say, a NAND logic gate. Moreover, the NAND logic gate may be buffered to provide a better output signal when operating in conjunction with additional circuitry. The designer may thus select amongst a variety of circuit primitives that provide the common NAND logic function.

Also, the designer may design a specialized circuit that performs the NAND logic function from scratch as a circuit comprising the transistor circuit primitives. The designer may store the specialized circuit in its transistorized form in the schematic database 32, 34. Alternatively, the designer may define the specialized circuit to be a new circuit primitive for a NAND logic gate.

A circuit primitive data structure may include a graphical symbol for the schematic, parameters that describe the function of the circuit primitive to the CAD system 10, parameters that describe the geometric structure of the respective electronic component on the integrated circuit substrate, and parameters describing the electrical characteristics of the electronic circuit block or electronic component to the CAD system 10 for purposes of simulating the electrical behavior of the schematic. It should be understood that these parameters are for illustration only and do not limit the circuit primitive data structures and the schematic databases 32, 34 of CAD systems 10 to the parameters described above. For example, some CAD systems 10 permit the designer to create and associate additional parameters with the circuit primitive, which parameters are stored in the schematic database 32, 34 as part of an amended circuit primitive data structure.

In the source schematic database 32, a source schematic 38 includes source circuit primitives that are associated with the source schematic database 32, and interconnections among the source circuit primitives. In a preferred embodiment, the source schematic 38 is stored in the source schematic database 32 as separately identified entries for the source circuit primitives or electronic circuit blocks with identifiers for the terminals of each source circuit primitive or electronic circuit block. The source schematic database 32 also includes a list of which terminals are interconnected. For example, the source circuit primitives or electronic circuit blocks may be stored as nodes in a root-and-tree database structure, as is familiar to those of ordinary skill in the art, and the interconnections may be stored as links between the nodes.

The schematic migration process 36 converts the source schematic 38 comprising source circuit primitives into the target schematic 40 comprising target circuit primitives. For example, in the Cadence CAD system, the schematic migration process 36 is performed by a utility program that is written in the SKILL computer language developed by Cadence Design Systems, Inc. of San Jose, Calif. In the schematic migration process 36, the CAD system 10 attempts to associate every source circuit primitive with a corresponding target circuit primitive. The CAD system 10 also attempts to associate terminals for the target circuit primitive with respective terminals for the corresponding source circuit primitive. The CAD system 10 constructs the target schematic 40 by retaining the selection of circuit primitives and interconnections used in the source schematic 38 but substituting the target circuit primitives and terminals for the respective source circuit primitives and terminals. The CAD system 10 stores the constructed target schematic 40 in the target schematic database 34.

Associating Circuit Primitives

Figure 3:
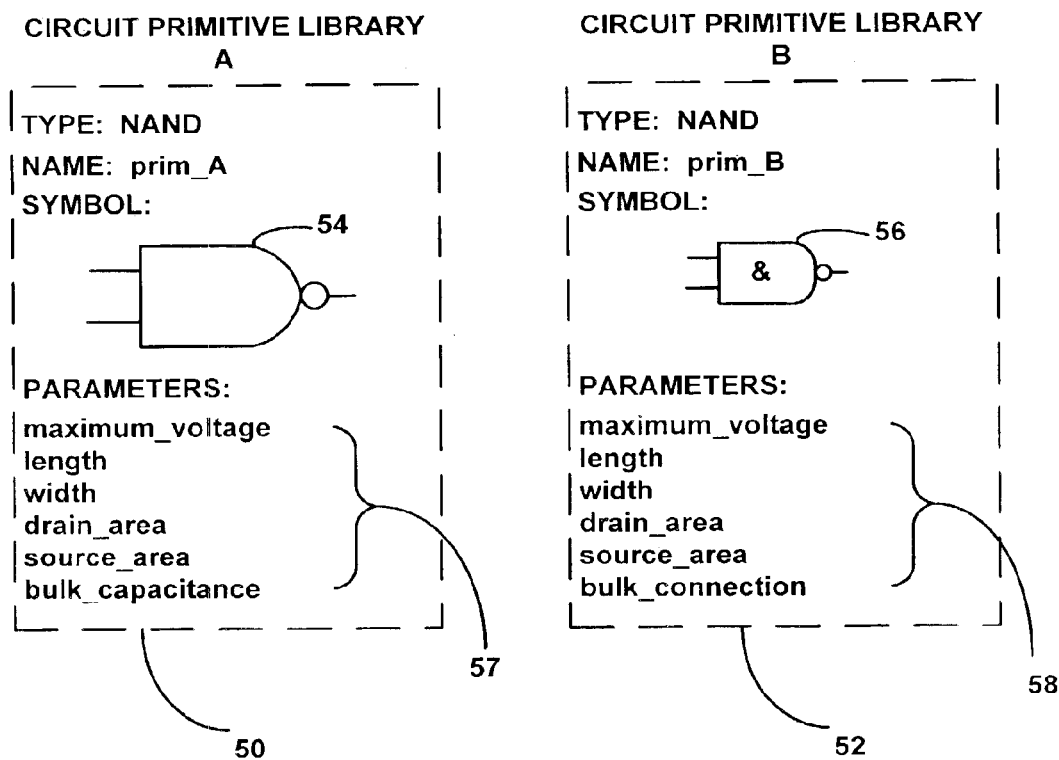
FIG. 3 is a block diagram illustrating an exemplary source circuit primitive and an exemplary target circuit primitive in the computer-aided integrated circuit design system of FIG. 1.

A step of the schematic migration process 36 is associating a target circuit primitive with a source circuit primitive. FIG. 3 is a block diagram illustrating an exemplary source circuit primitive 50 and an exemplary target circuit primitive 52 in the computer-aided integrated circuit design system 10 of FIG. 1. The source circuit primitive 50 may be stored as a data structure in the source circuit primitive library, which is part of the source schematic database 32. The target circuit primitive 52 may be stored as a data structure in the target circuit primitive library, which is part of the target schematic database 34. Each data structure comprises binary information for objects that are grouped together, the grouping represented here by the dotted lines of the circuit primitives 50, 52. Each data structure may group objects of varying types, such as a binary representation of a graphical symbol, numerical data, and text strings, or pointers to these objects.

The source schematic database 32 may be from an external vendor that sells its proprietary schematics to the designer. Alternatively, the source schematic database 32 may be from another design team that is cooperating on designing the integrated circuit, but whose schematic database 32 is different from the target schematic database 34 used by the designer. Additionally, as manufacturing technology develops, a source schematic 38 designed originally in older technology may be the basis for the target schematic 40 in the newer technology. For example, the designer may reuse the source schematic 38 from the source schematic database for 170 nm CMOS technology as a basis for target schematics 40 for 140 nm or 110 nm target technologies. The schematic databases for 170 nm, 140 nm, and 110 nm technologies may differ in several ways. For example, circuit primitives for 110 nm transistors may be associated with more parameters compared to 140 nm or 170 nm transistors because the behavior of 110 nm transistors is more sensitive to variations in parameters for doping, structure, and component separation on the integrated circuit.

The exemplary source circuit primitive 50 is the circuit primitive for a NAND logic gate from source circuit primitive library A. The data structure for the NAND logic gate is named as "prim_A" in the source circuit primitive library A. The data structure may include a graphical symbol 54 for the NAND logic gate and parameters that describe physical and/or electrical characteristics of the electronic component source corresponding to the source circuit primitive 50. When the CAD system 10 reads an occurrence of prim_A from the source schematic 38, the CAD system 10 draws the graphical symbol 54 for the NAND logic gate on the display 18 of the workstation 12 through the GUI. Additionally, the CAD system 10 may calculate the combined physical and/or electrical characteristics of a group of circuit primitives 50 in a schematic 38. The parameters 57 in the primitive 50 are the names of computer program variables that are used to calculate the combined characteristics of a schematic 38 as a function of the values of the variables.

Similarly, the exemplary target circuit primitive 52 is the circuit primitive for a NAND logic gate from target circuit primitive library B. The data structure for the NAND logic gate is named as "prim_B" in the target circuit primitive library B. The data structure may include a graphical symbol 56 for the NAND logic gate and parameters 58 for the electronic component associated with the circuit primitive 52.

During the schematic migration process 36, the CAD system 10 associates source circuit primitives 50 with corresponding target circuit primitives 52. The association may be performed by a utility program running on the CAD system 10. The source schematic 38 is converted to the target schematic 40 by replacing the source circuit primitives 50 with the target circuit primitives 52. For example, the CAD system 10 replaces occurrences of prim_A in the source schematic 38 with prim_B from the target circuit primitive library B.

Typically, the association of a particular source circuit primitive 50 with a corresponding target circuit primitive 52 is determined by whether the source 50 and target 52 primitives include the same character string for the type of circuit primitive. Alternatively, the schematic migration utility program consults a file where the name "prim_A" of the source circuit primitive library A in the source schematic database 32 has previously been associated with the name "prim_B" of the target circuit primitive library B in the target schematic database 34. Also as an alternative, the schematic migration utility program may associate the two circuit primitives 50, 52 that have the most number of parameters 57, 58 in common.

Figure 4:
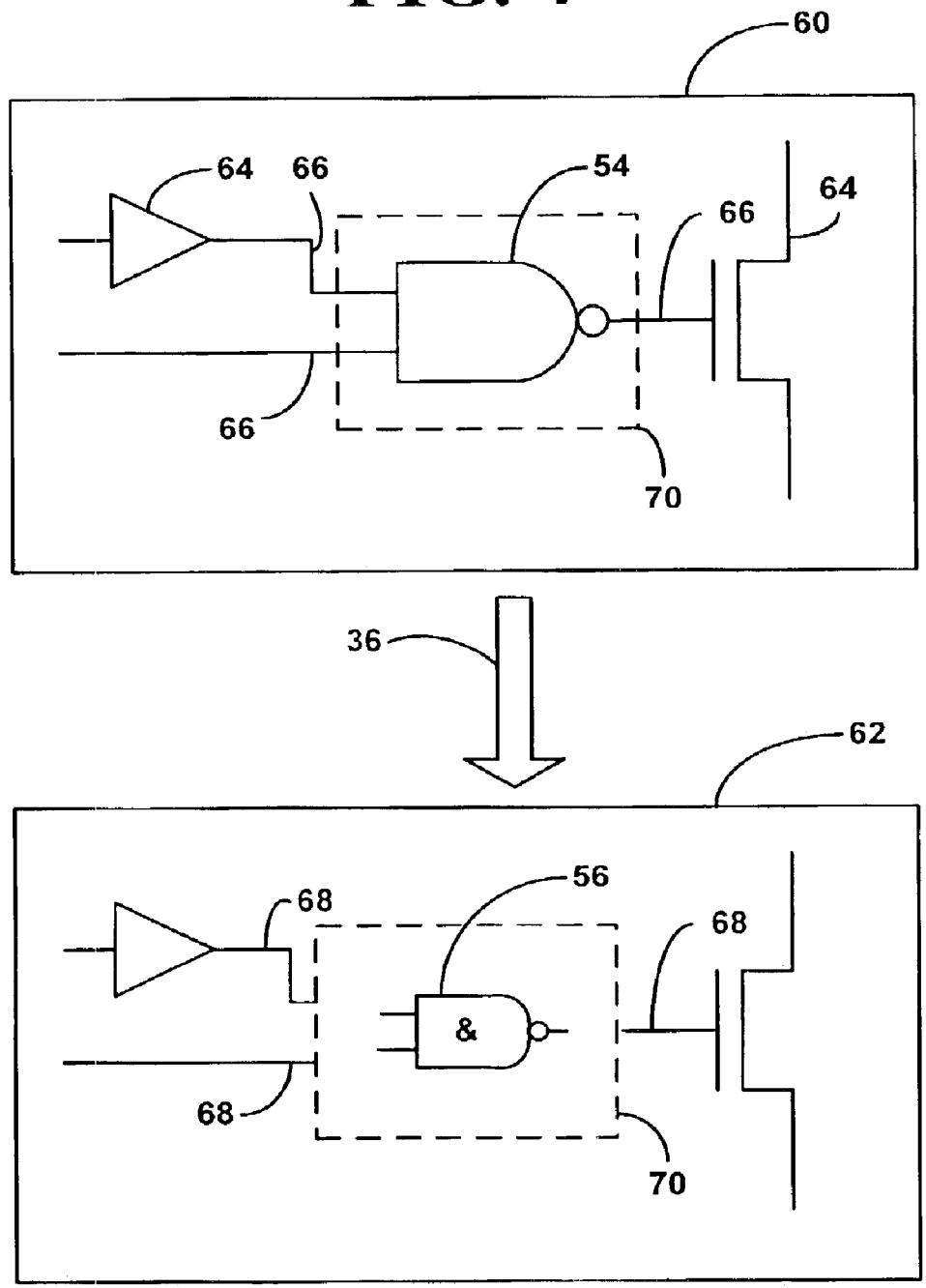
FIG. 4 is a block diagram illustrating a schematic migration process from a source schematic to a target schematic wherein the graphical symbols are mismatched.

FIG. 4 is a block diagram illustrating a schematic migration process 36 from a source schematic 60 to a target schematic 62 wherein the graphical symbols 54, 56 are mismatched. In the source schematic 60, the graphical symbol 54 for the source circuit primitive 50 connects to the graphical symbols for other components 64 in the source schematic 60 through connecting lines 66. The graphical symbol 54 for the source circuit primitive 50 occupies a display area 70 on the graphical display screen 18 of the CAD system 10.

The display area 70 may be determined by a measure of the size of the object corresponding to the graphical symbol 54 in the data structure for the source circuit primitive 50. For example, the object corresponding to the graphical symbol 54 may include data representing the width and height of the graphical symbol 54 in bits or units of length, such as if the object is stored in a raster format as is familiar to those of skill in the art. The CAD system 10 reads the width and height data and calculates appropriate dimensions for the graphical area 70 on the graphical display screen 18. Alternatively, the CAD system 10 may determine the size of the object corresponding to the graphical symbol 54 from the total number of bits that comprise the object, from which the CAD system 10 calculates the appropriate dimensions for the graphical area 70.

But when the CAD system 10 replaces the source circuit primitive 50 with the target circuit primitive 52 in the source schematic 60 to create the target schematic 62, the graphical symbols 54, 56 may be mismatched. A source of the mismatch is that a straightforward replacement of the data structure prim_A in the source schematic 60 by the data structure prim_B also replaces the object corresponding to the source graphical symbol 54 by the object corresponding to the target graphical symbol 56. There may not be a one-to-one correspondence of all objects in the data structures for the two circuit primitives 50, 52. In one case, the objects may have differing sizes. Consequently, as is depicted in FIG. 4, the target graphical symbol 56 may not fill the graphical area 70 in the target schematic 62 that was occupied by the source graphical symbol 54 in the source schematic 60.

A consequence of the mismatched target graphical symbol 56 may be dangling lines 68 in the target schematic 62. Dangling lines 68 are lines that do not appear to connect to the target graphical symbol 56 on the graphical display screen 18 of the CAD system 10. Further, some CAD systems 10 may interpret the dangling lines 68 as an absence of electrical connections among the components in the target schematic 62. The absence of electrical connections may be interpreted by the CAD system 10 as due to an electrically incomplete target schematic 62, which may prompt the CAD system 10 to issue an error message associated with an invalid target schematic 62.

Figure 5:
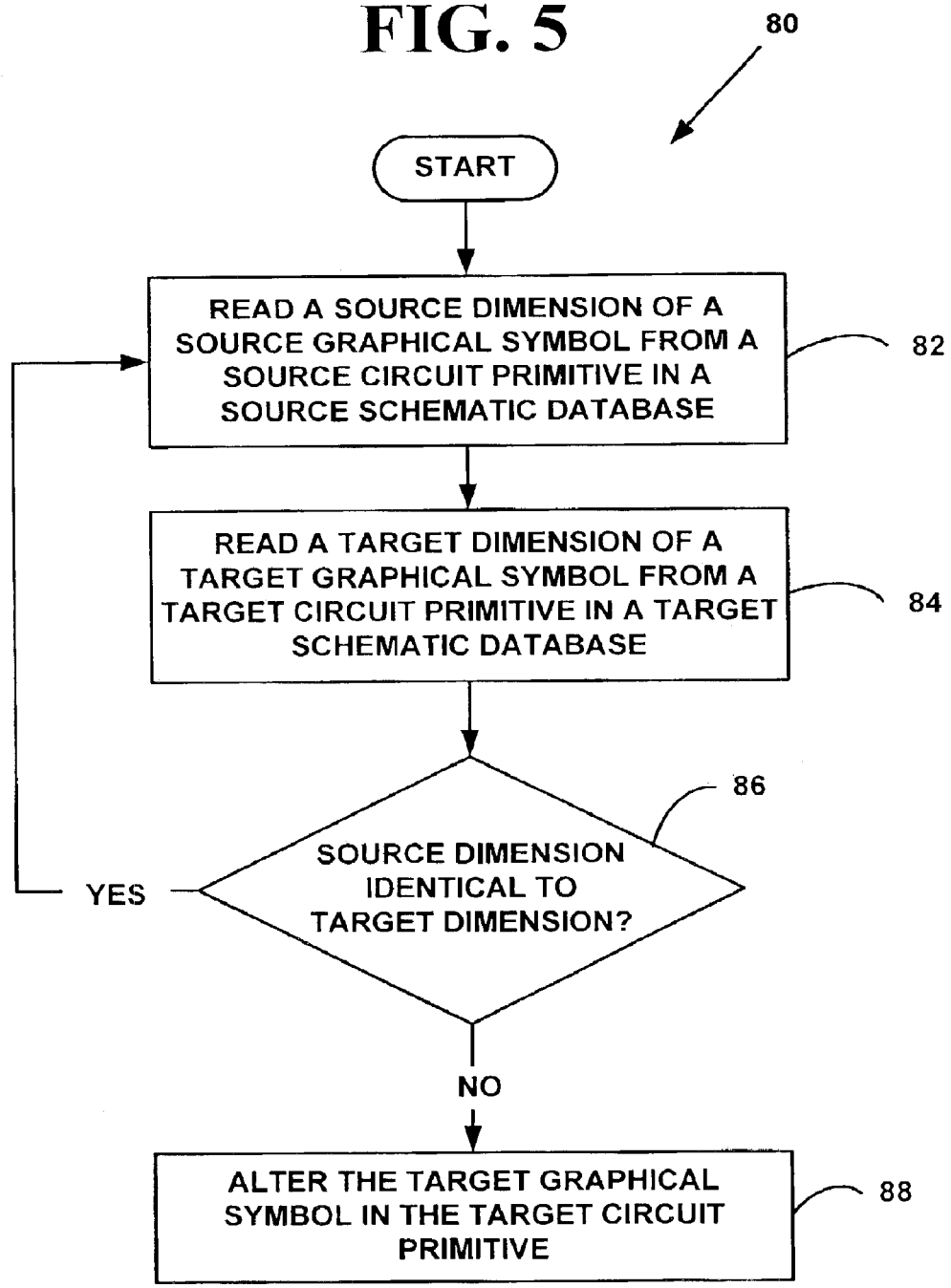
FIG. 5 is a flow diagram illustrating a preferred method of resolving mismatched graphical symbols in the computer-aided integrated circuit design system of FIG. 1.

FIG. 5 is a flow diagram illustrating a preferred method 80 of resolving mismatched graphical symbols 54, 56 in the CAD system 10 of FIG. 1. The method includes reading a source dimension of a source graphical symbol 54 from a source circuit primitive 50 in a source schematic database 32 at step 82. At step 84, the CAD system reads a target dimension of a target graphical symbol 56 from a target circuit primitive 52 in a target schematic database 34. The target circuit primitive 52 corresponds to the source circuit primitive 50. The CAD system 10 automatically compares the source dimension with the target dimension at step 86 and alters the target graphical symbol 56 in the target circuit primitive 52 if the source dimension and the target dimension are not identical at step 88.

At step 82, the CAD system 10 reads a source dimension of the source graphical symbol 54 from the source circuit primitive 50. The CAD system 10 may search the source schematic database 32, or the source primitive library therein, for the data structure corresponding to the source circuit primitive 50. The CAD system 10 finds an address in the memory for the data structure corresponding to the source circuit primitive 50 and loads the binary information corresponding to the data structure into RAM. From the data structure, the CAD system 10 extracts an object corresponding to the source graphical symbol 54. In one embodiment, the source dimension for the source graphical symbol 54 is a height or width measurement of the source graphical symbol 54. The object in the data structure corresponding to the source graphical symbol 54 may include the height or width in bits or units of length, such as font points, inches, millimeters, or any other measure of size on the graphical display screen 18 that is recognizable by the CAD system 10.

Similarly, at step 84, the CAD system 10 reads a target dimension of the target graphical symbol 56 from the target circuit primitive 52. The CAD system 10 may search the target schematic database 34, or the target primitive library therein, for the data structure corresponding to the target circuit primitive 52. The CAD system 10 finds an address in the memory for the data structure corresponding to the target circuit primitive 52 and loads the binary information corresponding to the data structure into RAM. From the data structure, the CAD system 10 extracts an object corresponding to the target graphical symbol 56. In one embodiment, the target dimension for the target graphical symbol 56 is a height or width measurement of the target graphical symbol 56. The object in the data structure corresponding to the target graphical symbol 56 may include the height or width in bits or units of length, such as font points, inches, millimeters, or any other measure of size on the graphical display screen 18 that is recognizable by the CAD system 10.

In another embodiment, the source or target dimension for the graphical symbols 54, 56 is an area measurement, such as the number of bits in the object in the data structure corresponding to the graphical symbol 54, 56. It should be understood, however, that the above dimensions are for illustrative purposes only, that the present invention is not restricted to the above-described embodiments, and that other measurements of the dimensions are possible. For example, the data structure corresponding to the source 50 or target 52 circuit primitive may include a data object representing a scale factor for presenting the graphical symbol 54, 56 on the graphical display unit 18 of the CAD system 10.

The target circuit primitive 52 corresponds to the source circuit primitive 50. For example, in the case of the circuit primitives 50, 52 depicted in FIG. 3 both circuit primitives 50, 52 perform the function of a two-input NAND logic gate. The circuit primitives 50, 52 may also be associated with the CAD system 10 due to other common properties, such as the impedances of inputs or outputs, supply voltage ranges, or switching speed.

The CAD system 10 automatically compares the source and target dimensions at step 86. The source and target dimensions that are compared are of the same type, i.e., comparing height of the source graphical symbol 54 with the height of the target graphical symbol 56, not its width. The comparison may be a numerical comparison of the data representing the height, width, or area of the source 54 and target 56 graphical symbols.

If the source and target dimensions are not identical, at step 88 the CAD system 10 alters the target graphical symbol 56 in the target circuit primitive 52. In one preferred embodiment, the CAD system 10 alters the target graphical symbol 56 by replacing the target graphical symbol 56 in the target circuit primitive 52 with the source graphical symbol 54 from the source circuit primitive 50. For example, FIG. 6 is a block diagram illustrating an exemplary target circuit primitive 90 with a replaced mismatched target graphical symbol 56 in the CAD system 10 of FIG. 1.

In the method 80 of FIG. 5, other objects in the target circuit primitive 52 may be retained by the altered target circuit primitive 90. For example, as depicted in FIG. 6, the target parameters 58 of the target circuit primitive 52 are retained in the altered target circuit primitive 90. Although the mismatched target graphical symbol 56 is replaced, the function of the symbol remains the same, in this case a two-input NAND logic gate.

To distinguish the altered target circuit primitive 90 from the target circuit primitive 52 that included the mismatched target graphical symbol 56, the data structure corresponding to the altered target circuit primitive 90 may be renamed. For example, to indicate to the CAD system 10 that the altered target circuit primitive 90 does not include the mismatched target graphical symbol 56, the altered target circuit primitive 90 may be named "prim_B_repPrim_A" to signify that the altered target circuit primitive 90 is a member of circuit primitive library B but has the mismatched target graphical symbol 56 replaced by the source graphical symbol 54 from data structure prim_A.

During the schematic migration process 36, the CAD system 10 associates the source circuit primitive 50 (prim_A) with the altered target circuit primitive 90 (prim_B_repPrim_A) rather than the mismatched target circuit primitive 52 (prim_B). For example, the CAD system 10 may change the file that the CAD system consults for associating circuit primitives to associate the name "prim_A" with "prim_B_repPrim_A." Now during the schematic migration process 36, the CAD system 10 replaces occurrences of prim_A in the source schematic 60 with prim_B_repPrim_A from the target circuit primitive library B. As a result of the method 80, the target graphical symbol 54 in the altered target circuit primitive 90 is identical to the source graphical symbol 54, and the altered target graphical symbol 54 will fill the graphical area 70 in the target schematic 62.

Figure 7:
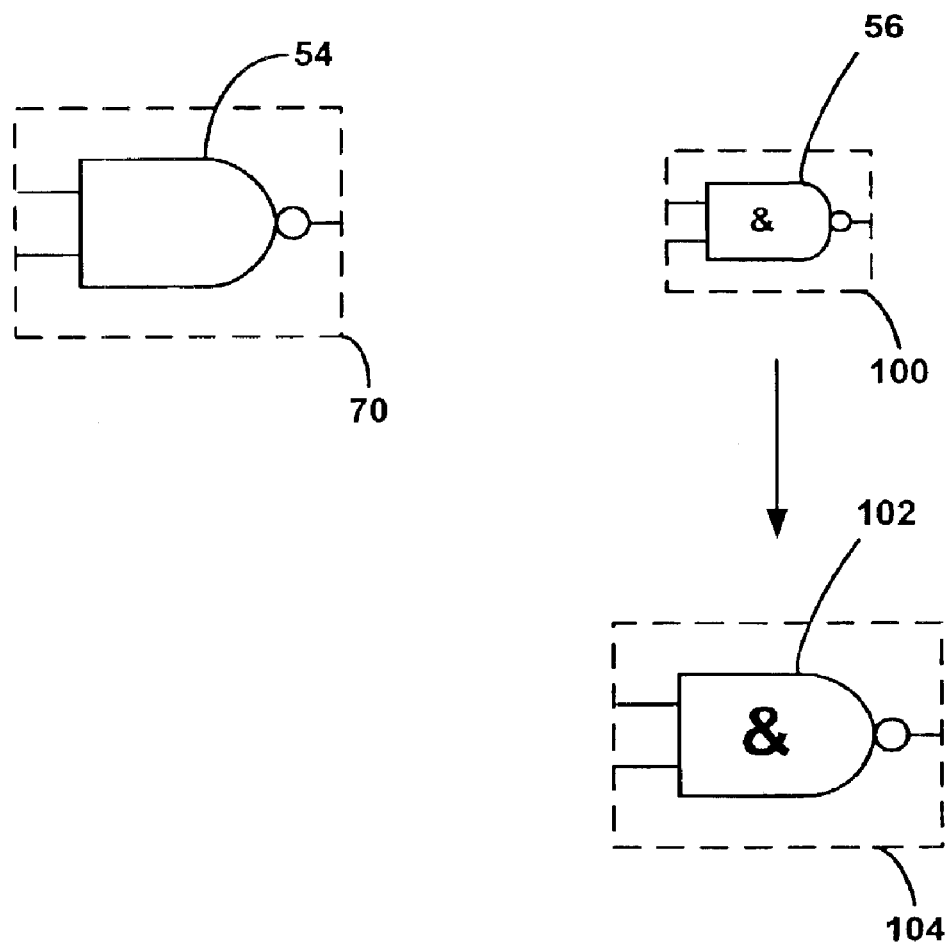
FIG. 7 is a diagram illustrating creating a resized target graphical symbol.

In another preferred embodiment, the CAD system 10 creates a new target graphical symbol 102 to fit the graphical area 70 on the graphical display screen 18. FIG. 7 is a diagram illustrating creating a resized target graphical symbol 102. In one embodiment, the CAD system 10 resizes the graphical area 100 of the mismatched target graphical symbol 56 to a resized graphical area 104. The CAD system 10 includes graphical software that stretches or scales the mismatched target graphical symbol 56 to produce a resized target graphical symbol 102. Stretching a graphical object is a graphical operation of enlarging or shrinking the graphical object along one axis, whereas scaling is a graphical operation of enlarging or shrinking the graphical object along two axes by a common factor.

The CAD system 10 reads the source dimension of the source graphical symbol 54 and the target dimension of the mismatched target graphical symbol 56 as described above. The resized target graphical symbol 102 has a resized target dimension as a measure of the extent of stretching or scaling. The CAD system 10 performs the resizing operation such that the resized target dimension of the resized target graphical symbol 102 is the same as the source dimension of the source graphical symbol 54. The resizing is such that the resized target graphical symbol 102 has the same dimensions as the source graphical symbol 54 and that, when inserted into the target schematic 62, there are no dangling lines 68 and the CAD system 10 does not issue an error message associated with an invalid target schematic 62.

FIG. 8 is a block diagram illustrating an altered target circuit primitive 110 with the resized target graphical symbol 102 of FIG. 7. The mismatched target graphical symbol 56 of the mismatched target circuit primitive 52 is replaced by the resized target graphical symbol 102. Other objects in the target circuit primitive 52 may be retained by the altered target circuit primitive 110. For example, as depicted in FIG. 8, the target parameters 58 of the target circuit primitive 52 are retained in the altered target circuit primitive 110. As described above, the data structure corresponding to the altered target circuit primitive 110 may be renamed to indicate to the CAD system 10 that the altered target circuit primitive 110 does not include the mismatched target graphical symbol 56. For example, the altered target circuit primitive 110 may be named "prim_B_sizePrim_A" to signify that the altered target circuit primitive 110 is a member of circuit primitive library B but has the mismatched target graphical symbol 56 replaced by the resized target graphical symbol 102. Now during the schematic migration process 36, the CAD system 10 replaces occurrences of prim_A in the source schematic 60 with prim_B_sizePrim_A from the target circuit primitive library B.

Figure 9:
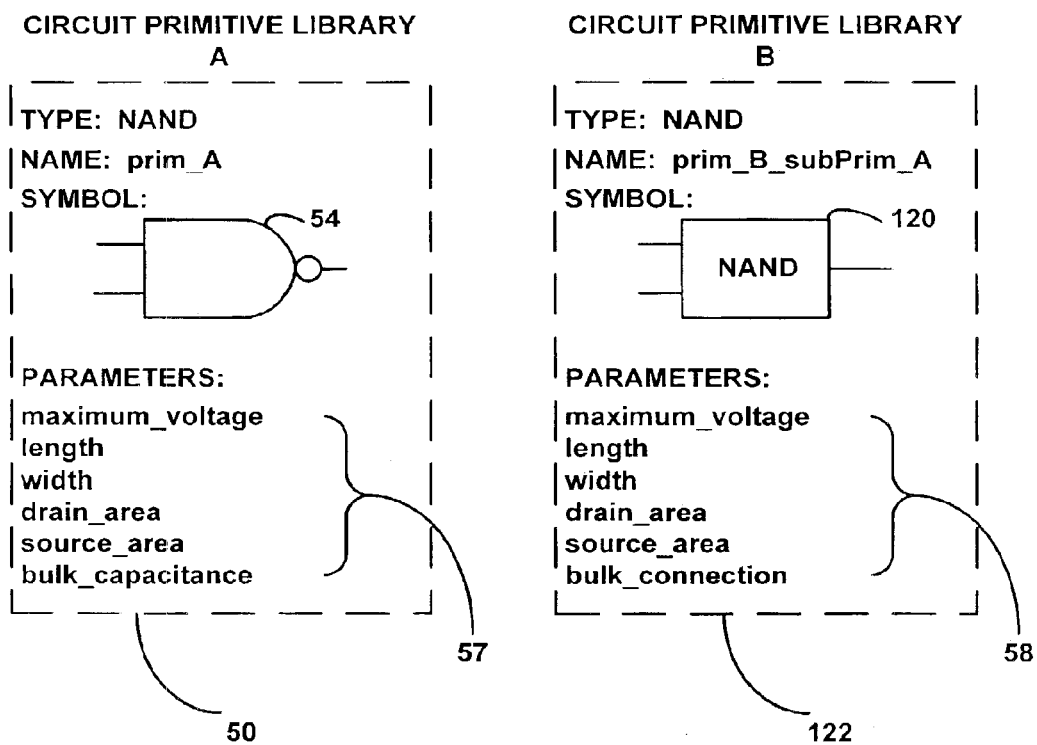
FIG. 9 is a block diagram illustrating an altered target circuit primitive with a substitute target graphical symbol.

In another preferred embodiment, the CAD system 10 may create a substitute target graphical symbol 120. FIG. 9 is a block diagram illustrating an altered target circuit primitive 122 with a substitute target graphical symbol 120. The CAD system 10 generates a substitute graphical symbol 120 that is functionally equivalent to the target graphical symbol 56. The substitute target graphical symbol 120 may take the form of a "black box" circuit in the target schematic database 34 that has the same function as the mismatched target graphical symbol 56, in this case a two-input NAND logic gate. The substitute graphical symbol 120 may include the character string signifying the type of the mismatched target circuit primitive 56 to distinguish the substitute graphical symbol 120 in the target schematic 62 from other circuit primitives.

The substitute graphical symbol 120 has a substitute target, equal to the source dimension of the source graphical symbol 54. The substitute target dimension is such that the substitute target graphical symbol 120 has the same dimensions as the source graphical symbol 54 and that, when inserted into the target schematic 62, there are no dangling lines 68 and the CAD system 10 does not issue an error message associated with an invalid target schematic 62. Other objects in the target circuit primitive 52 may be retained by the altered target circuit primitive 122. For example, as depicted in FIG. 9, the target parameters 58 of the target circuit primitive 52 are retained in the altered target circuit primitive 122. As described above, the data structure corresponding to the altered target circuit primitive 122 may be renamed to indicate to the CAD system 10 that the altered target circuit primitive 122 does not include the mismatched target graphical symbol 56. For example, the altered target circuit primitive 122 may be named "prim_B_subPrim_A" to signify that the altered target circuit primitive 122 is a member of circuit primitive library B but has the mismatched target graphical symbol 56 replaced by the substitute target graphical symbol 120. Now during the schematic migration process 36, the CAD system 10 replaces occurrences of prim_A in the source schematic 60 with prim_B_subPrim_A from the target circuit primitive library B.

During the process of schematic migration, the method 80 of resolving mismatched graphical symbols recognizes the mismatch and alters the graphical symbols automatically. In a preferred embodiment, the CAD system 10 creates a log file of actions taken during the method 80 of resolving mismatched graphical symbols during the schematic migration process 36. For example, the CAD system 10 may create an ASCII file when the schematic migration utility is loaded into RAM and run on the CPU of the workstation 12. As the CAD system 10 identifies each source circuit primitive 50 in the source schematic database 32 and finds the associated target circuit primitive 52 in the target schematic database 34, the CAD system 10 performs the resolution method 80 described above. If the CAD system 10 detects mismatched graphical symbols at step 86, the CAD system 10 writes the names of either or both circuit primitives as a character string to the log file. The CAD system 10 may also write the names, if any, of either or both objects corresponding to the graphical symbols to the log file. Further, if the CAD system 10 alters the target graphical symbol, the CAD system 10 may also write name of the altered target circuit primitive 90, 110, 122 to the log file or a description of the action taken: replacement, resizing, or substitution of the mismatched target graphical symbol 56.

The foregoing detailed description is merely illustrative of several embodiments of the invention. Variations of the described embodiments may be encompassed within the purview of the claims. The steps of the flow diagrams may be taken in sequences other than those described, and more or fewer elements or components may be used in the block diagrams. Accordingly, any description of the embodiments in the specification should be used for general guidance, rather than to unduly restrict any broader descriptions of the elements in the following claims.

We claim:

1. A method of resolving mismatched graphical symbols in a computer-aided integrated circuit design system, the method comprising:

(a) reading a source dimension of a source graphical symbol from a source circuit primitive in a source schematic database, the source schematic database having a source schematic including source circuit primitives;

(b) reading a target dimension of a target graphical symbol from a target circuit primitive in a target schematic database, the target schematic database having a target schematic including source circuit primitives, wherein the target circuit primitive corresponds to the source circuit primitive;

(c) automatically comparing the source dimension with the target dimension; and (d) altering the target graphical symbol in the target circuit primitive if the source dimension and the target dimension are not identical, to obtain an altered target graphical symbol, the target graphical symbol being altered along at least one target dimension such that there are no dangling lines when the altered target graphical symbol is inserted into a target schematic in the target schematic database.

2. The method of claim 1, wherein the source dimension is selected from the group consisting of: width, height, and area.

3. The method of claim 1, wherein the target dimension is selected from the group consisting of: width, height, and area.

4. The method of claim 1, wherein (d) comprises:
replacing the target graphical symbol in the target circuit primitive with the source graphical symbol if the source dimension and the target dimension are not identical.

5. The method of claim 1, wherein (d) comprises:
resizing the target graphical symbol so that the altered target graphical symbol has a resized target dimension equal to the source dimension; and
replacing the target graphical symbol in the target circuit primitive with the resized target graphical symbol.

6. The method of claim 5, wherein the resized target dimension is selected from the group consisting of: width, height, and area.

7. The method of claim 1, wherein (d) comprises:
substituting the target graphical symbol by a substitute target graphical symbol as the altered target graphical symbol, wherein the substitute target graphical symbol has as a substitute target dimension equal to the source dimension, and wherein a function of the substitute target graphical symbol is equal to a function of the target graphical symbol; and
replacing the target graphical symbol in the target circuit primitive with the substitute target graphical symbol.

8. The method of claim 7, wherein the substitute target dimension is selected from the group consisting of: width, height, and area.

9. The method of claim 1 further comprising:
(e) renaming the target circuit primitive to obtain a name for a target circuit primitive having the altered target graphical symbol.

10. The method of claim 1 further comprising:
(e) creating a log file of actions performed during steps (a), (b), (c) and (d).

11. A computer readable medium, having stored therein instructions for causing a central processing unit to execute the steps of:
(a) reading a source dimension of a source graphical symbol from a source circuit primitive in a source schematic database, the source schematic database having a source schematic including source circuit primitives;
(b) reading a target dimension of a target graphical symbol from a target circuit primitive in a target schematic database, the target schematic database having a target schematic including source circuit primitives, wherein the target circuit primitive corresponds to the source circuit primitive;
(c) automatically comparing the source dimension with the target dimension; and
(d) altering the target graphical symbol in the target circuit primitive if the source dimension and the target dimension are not identical, to obtain an altered target graphical symbol, the target graphical symbol being altered along at least one target dimension such that there are no dangling lines when the altered target graphical symbol is inserted into a target schematic in the target schematic database.

12. A system for resolving mismatched graphical symbols in a computer-aided integrated circuit design system, comprising:
means for reading a source dimension of a source graphical symbol from a source circuit primitive in a source schematic database, the source schematic database having a source schematic including source circuit primitives;
means for reading a target dimension of a target graphical symbol from a target circuit primitive in a tarot schematic database, the target schematic database having a target schematic including source circuit primitives, wherein the target circuit primitive corresponds to the source circuit primitive;
means for automatically comparing the source dimension with the target dimension; and
means for altering the target graphical symbol in the target circuit primitive if the source dimension and the target dimension are not identical, to obtain an altered target graphical symbol, the target graphical symbol being altered along at least one target dimension such that there are no dangling lines when the altered target graphical symbol is inserted into a target schematic in the target schematic database.

13. A method of resolving mismatched graphical symbols in a computer-aided integrated circuit design system, the method comprising:
(a) reading a source dimension of a source graphical symbol from a source circuit primitive in a source schematic database;
(b) reading a target dimension of a target graphical symbol from a target circuit primitive in a target schematic database, wherein the target circuit primitive corresponds to the source circuit primitive;
(c) automatically comparing the source dimension with the target dimension; and
(d) altering the target graphical symbol in the target circuit primitive if the source dimension and the target dimension are not identical, by replacing the target graphical symbol in the target circuit primitive with the source graphical symbol.

14. A system for resolving mismatched graphical symbols in a computer-aided integrated circuit design system, comprising:
means for reading a source dimension of a source graphical symbol from a source circuit primitive in a source schematic database;
means for reading a target dimension of a target graphical symbol from a target circuit primitive in a tarot schematic database, wherein the target circuit primitive corresponds to the source circuit primitive;
means for automatically comparing the source dimension with the target dimension; and
means for altering the target graphical symbol in the target circuit primitive if the source dimension and the target dimension are not identical, wherein the means for altering is operative to replace the target graphical symbol in the target circuit primitive with the source graphical symbol.

* * * * *